US 6,492,839 B2

(12) United States Patent
Wang et al.

(10) Patent No.: US 6,492,839 B2
(45) Date of Patent: Dec. 10, 2002

(54) LOW POWER DYNAMIC LOGIC CIRCUIT

(75) Inventors: Jinn-Shyan Wang, Chia-Yi (TW);
Ching-Rong Chang, Chi-Lung (TW);
Ching-Wei Yeh, Ming-Hsiung Hsiang
(TW)

(73) Assignee: National Chung Cheng University,
Chia-Yi County (TW)

( * ) Notice: Subject to any disclaimer, the term of this
patent is extended or adjusted under 35
U.S.C. 154(b) by 0 days.

(21) Appl. No.: 09/854,113

(22) Filed: May 11, 2001

(65) Prior Publication Data
US 2002/0167335 A1 Nov. 14, 2002

(51) Int. Cl.[7] .............................................. H03K 19/096
(52) U.S. Cl. .............................................. 326/98; 326/95
(58) Field of Search ................................ 326/98, 95–97,
326/93; 365/203

(56) References Cited

U.S. PATENT DOCUMENTS 5,764,089 A * 6/1998 Partovi et al. .............. 327/200
6,081,130 A * 6/2000 Cao et al. ..................... 326/55
6,150,848 A * 11/2000 Fouts et al. ................... 326/96
6,201,425 B1 * 3/2001 Kartschoke et al. ......... 327/211

OTHER PUBLICATIONS

Floyd, Digital Fundamentsl, 1986, Charles E. Merrill Publishing Company, 3rd Edition, 86–87, 90–91.*

* cited by examiner

Primary Examiner—Michael Tokar
Assistant Examiner—James H. Cho
(74) Attorney, Agent, or Firm—J.C. Patents

(57) ABSTRACT

A low power dynamic logic circuit. By shifting a discharge NMOS transistor of a conventional dynamic logic circuit between an output terminal and a logic block, plus an additional charge and discharge control, the operation speed and power consumption of a dynamic circuit can be effectively improved. Using the charge redistribution to speed up the circuit operation and to reduce the body effect that affects the operation speed, the speed of the novel dynamic logic circuit is enhanced. By transferring the lump capacitor of the charge/discharge, the dynamic power can be effectively reduced. The lower power dynamic logic circuit can be used independently or combined with a conventionally dynamic logic circuit.

17 Claims, 10 Drawing Sheets

LOW POWER DYNAMIC LOGIC CIRCUIT

BACKGROUND OF THE INVENTION

1. Field of the Invention

The invention relates in general to a dynamic logic circuit, and more particularly, to a low power dynamic logic circuit.

2. Description of the Related Art

CMOS dynamic circuits originated in the 1980s. Since the CMOS circuit employing repetitive transistor networks (NMOS transistor network and PMOS network) to implement the circuit required excessive hardware, a single-side transistor network (only NMOS transistor network or PMOS network) replaced the CMOS circuit. However, the single-side transistor network is not supposed to lose the advantage of no static power consumption of the CMOS circuit. With this in mind, the CMOS dynamic circuit is developed and fabricated.

FIG. 1 shows a conventional dynamic logic circuit. In FIG. 1, the dynamic logic circuit comprises a PMOS transistor 102, a logic block 104 and an NMOS transistor 106. The PMOS transistor 102 and the NMOS transistor 106 are controlled by the same clock signal $\phi$, which is illustrated in FIG. 1B. The logic block 104 is used to implement a Boolean function. The dynamic logic circuit as shown in FIG. 1 controlled by the clock signal $\phi$ works in two phases, that is, a precharge phase and an evaluation phase. When the circuit works in the precharge phase, $\phi=0$, the PMOS transistor 102 is turned on, and the NMOS transistor 106 is turned off. Consequently, the output terminal O is charged to a high voltage (logic 1) via the PMOS transistor 102. When the circuit works in the evaluation phase, $\phi=1$, the PMOS transistor 102 is turned off, and the NMOS transistor 106 is turned on. Meanwhile, the logic block 104 is connected to the NMOS transistor 106 in series, so that the logic of the output terminal O is determined by the input terminal i to complete the Boolean function of the circuit.

FIG. 2A shows the way to use a domino circuit to construct the dynamic logic circuit. In FIG. 2A, two stages of domino circuit logic gates 202 and 204 are coupled to each other. The logic gates 202 and 204 are similar to each other with different complete logic. For example, the logic gate 202 comprises a logic unit 206 coupled to a driver unit 208, and the logic unit 206 comprises a PMOS transistor 210, a logic block 212 and an NMOS transistor 214 coupled together. The logic block 212 comprises an NMOS transistor 226 coupled to an NMOS transistor 228. The logic gate 204 comprises a logic unit 216 coupled to a driver unit 218. The logic unit 216 comprises a PMOS transistor 220, a logic block 222 and an NMOS transistor 224 coupled together. The logic block 222 comprises an NMOS transistor 230. The PMOS transistor 210, the PMOS transistor 220, the NMOS transistor 214 and the NMOS transistor 224 are controlled by the same clock signal $\phi$. The driver units 208 and 218 are made of inverters. The relative waveforms of the operation of the circuit are shown as FIG. 2B. The domino circuit is working in two phases, the precharge phase ($\phi=0$) and the evaluation phase ($\phi=1$). When $\phi=0$, the outputs Q and R of the logic units 206 and 216 are charged up to a high voltage. Through the inverter, the outputs P and Z of the logic gates 202 and 204 are 0. After $\phi=1$, initially, as the outputs P and Z are both low voltage, so that the NMOS transistor 230 to implement the Boolean function is shut off. However, when A and B are both logic 1, the output of the logic unit 206 is 0 after a time delay. Through the inverter, the output P is raised to logic 1. Similarly, when P is logic 1, Z is raised to logic 1 after a time delay. Accordingly, the data evaluation operation is performed sequentially without causing the problem of data race.

FIG. 3A shows a way of using a clock delay circuit to construct a dynamic logic circuit. In FIG. 3A, two stages of clock delay circuit logic gates 302 and 304 are coupled to each other. The logic gate 302 comprises a logic unit 306 that further comprises a PMOS transistor 308, a logic block 310 and an NMOS transistor 312 coupled together. The PMOS transistor 308 and the NMOS transistor 312 are controlled by the clock signal $\phi$. The logic gate 304 comprises a logic unit 314 that further comprises a PMOS transistor 316, a logic block 318 and an NMOS transistor 320. The PMOS transistor 316 and the NMOS transistor 320 are controlled by the clock signal $\phi_d$. The relative waveforms of the operation of the circuit are shown in FIG. 3B. In FIG. 3B, the clock delay circuit is operated under two phases, that is, a precharge phase ($\phi=0$, $\phi_d=0$) and an evaluation phase ($\phi=1$ and $\phi_d=1$). When $\phi=0$, $\phi_d=0$, the circuit is in the precharge phase. The outputs P and Z of the logic gates 302 and 304 are logic 1. When $\phi=1$, the logic gate 302 starts the evaluation. Meanwhile, $\phi_d$ is still 0. The output P is varied to logic 0 only when the input signals A and B are both logic 1. Consequently, $\phi_d$ is changed to 1. Meanwhile, the input of the logic gate 304 is stabilized, the output Z is not damaged by data race, and a correct evaluation can be performed.

Both the domino circuit and clock delay circuit are operated by applying the technique of an inverter gate or a clock delay to the logic unit. That is, the major part is still the logic unit. Therefore, if the performance of the logic unit is enhanced, for example, the operation speed is increased and the power consumption is reduced, the overall assembly of circuit can be enhanced.

FIG. 4 illustrates a conventional logic unit of a dynamic logic circuit with a NOR function. In FIG. 4, the logic unit of the logic circuit comprises a PMOS transistor 402, a logic block 404 and an NMOS transistor 406 coupled together. The PMOS transistor 402 and the NMOS transistor 406 are controlled by a clock signal $\phi$. The logic block 404 comprises k NMOS transistors connected in parallel. That is, the logic unit implements the NOR function with k inputs. When the logic block 404 connects k NMOS transistors in parallel, the parasitic capacitance of the drain and source regions are significant. The lump capacitor of the drain regions (including the parasitic capacitor and the wiring capacitor) is denoted by $C_1$ 408, while the lump capacitor of the source regions (including the parasitic capacitor and the wiring capacitor) is denoted by $C_2$ 410. When $\phi=0$ the PMOS transistor 402 charges the capacitors $C_1$ 408 and $C_2$ 410 up to $V_{DD}$ and $V_{DD}-V_{TN}$, wherein $V_{DD}$ is the operation voltage, and $V_{TN}$ is the threshold voltage of the NMOS transistor. When $\phi=0$, most of the input combinations (with a probability of $(2^k-1)/2^k$) enables the charges stored in $C_1$ 408 and $C_2$ 410 to leak. As the speed of the logic unit is determined according to the transition from 1 to 0 of the output terminals, the discharging time will seriously affect the operation speed. In addition, this dynamic power consumption is significant with a high probability and is a major factor that affects the power consumption of the circuit.

According to the above, the conventional dynamic logic circuit still has a lot drawbacks such as:

1. Significant power consumption.
2. Long operation time.

SUMMARY OF THE INVENTION

The invention provides a novel CMOS basic dynamic logic circuit to improve the problems of large power consumption and long operation time for the conventional dynamic logic circuit.

The novel dynamic logic circuit provided by the invention comprises a charge unit, coupled to a first clock signal, and a discharge unit, coupled to a second clock signal and the charge unit. The first and the second clock signal are in inverted phase to each other.

The charge unit comprises a PMOS transistor, an NMOS transistor, a feedback PMOS transistor and a logic gate. The PMOS transistor has a gate coupled to the first clock signal and a source region coupled to a voltage source. The NMOS transistor has a gate coupled to the first clock signal, a drain region coupled to a drain region of the PMOS transistor, and a source region coupled to the discharge unit. The feedback PMOS transistor has a drain region coupled to the drain region of the NMOS transistor, and a source region coupled to the voltage source. The logic gate has a first terminal coupled to the drain region of the PMOS transistor and a second terminal coupled to a gate of the feedback PMOS transistor.

The discharge unit comprises a logic block and an NMOS transistor. The logic block has a first terminal coupled to the charge unit and a second terminal coupled to a ground voltage. The NMOS transistor has a gate coupled to the second clock signal, a drain region coupled to the first terminal of the logic block, and a source region coupled to the ground voltage. The logic block includes an NMOS transistor network. When the first clock signal is logic 0 and the second clock is logic 1, the low power dynamic logic circuit is in a precharge phase. When the first clock signal is logic 1 and the second clock signal is logic 0, the low power dynamic logic circuit is in an evaluation phase.

When the circuit is performing the precharge operation, the output terminal is charged to logic 1, where the output terminal is coupled to the drain region of the PMOS transistor of the charge unit. Meanwhile, the charge unit and the discharge unit are isolated by the NMOS transistor of the charge unit. No matter which circuit the logic gate is, and no matter what the output voltage of the logic gate is, the voltage of the output terminal is not affected. The NMOS transistor of the discharge unit is on at this time, and the internal node is precharged to logic 0 (that is, discharging). The internal node is coupled to the drain region of the NMOS transistor of the discharge unit.

When the circuit is performing the evaluation operation, the PMOS transistor of the charge unit is off, while the NMOS transistor thereof is on. The charge unit and the discharge unit conduct with each other. The logic value of the output terminal is determined by the logic block. If the logic block is to obtain a value of 0, the output terminal is discharged to 0. If the logic block is to obtain a value of 1, the charge redistribution occurs since the output terminal is precharged to logic 1, while the internal node is precharged to logic 0. Only to make the logic value of the output of the logic gate opposite to that of the output terminal, the feedback PMOS transistor will helps the output terminal and the internal node to recharge to logic 1. The output of the current circuit can be connected to next stage via the logic gate. Or alternatively, an inverter can be added to bring the output to the next stage.

Both the foregoing general description and the following detailed description are exemplary and explanatory only and are not restrictive of the invention, as claimed.

DESCRIPTION OF THE PREFERRED EMBODIMENTS

First Embodiment

Figure 5A:
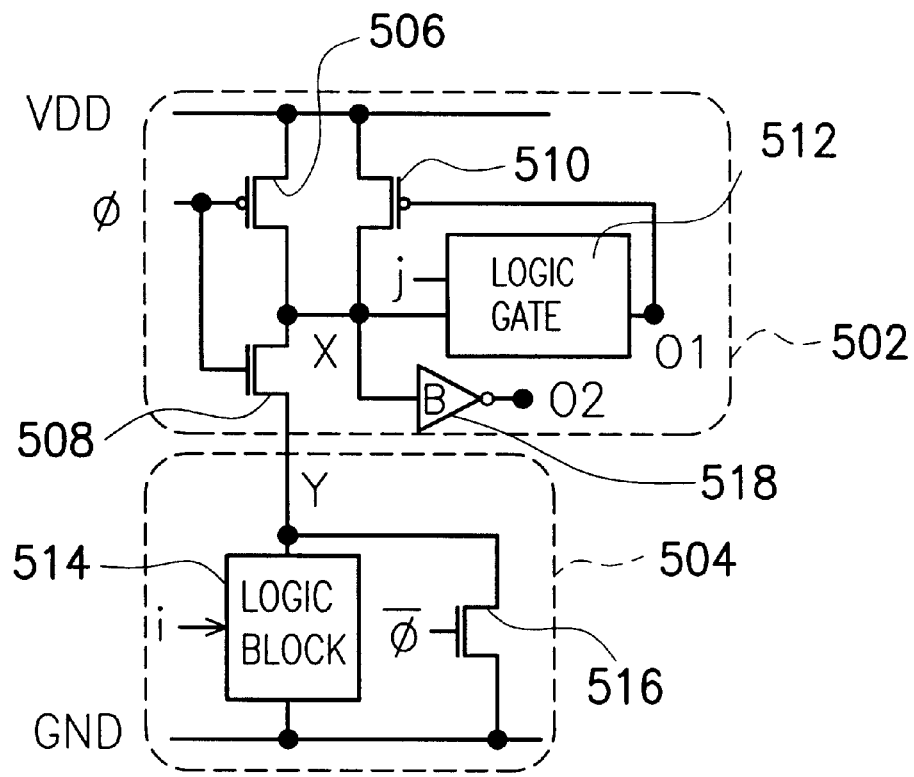
FIG. 5A shows a novel dynamic logic circuit according to the invention.

FIG. 5A shows a basic logic unit of the invention. The logic unit comprises two major parts: a charge unit (CU) 502 coupled to a first clock signal and a discharge unit (DU) 504 coupled to a second clock signal to reduce power consumption and reduce the operation time. The first clock signal has a phase opposite to the phase of the second clock signal.

The charge unit comprises a PMOS transistor 506, an NMOS transistor 508, a feedback PMOS transistor 510 and a logic gate 512. The PMOS transistor 506 has a gate coupled to the first clock signal and a source region coupled to a voltage source. The NMOS transistor 508 has a gate coupled to the first clock signal, a drain region coupled to a drain region of the PMOS transistor 506 and a source region coupled to the discharge unit 504 to isolate the connection with the discharge unit. The feedback PMOS transistor 510 has a drain region coupled to the drain region of the PMOS transistor 506, a source region coupled to the voltage source to provide a voltage to the charge unit 502 for recharging operation, and a gate coupled to a logic gate 512. The logic gate 512 has a first terminal coupled to the drain region of the PMOS transistor 506, and a second terminal coupled to the gate of the feedback PMOS transistor 510. A signal inverse to the drain region of the PMOS transistor 506 is provided from the second terminal of the logic gate to the feedback PMOS transistor 510.

Figure 5B:
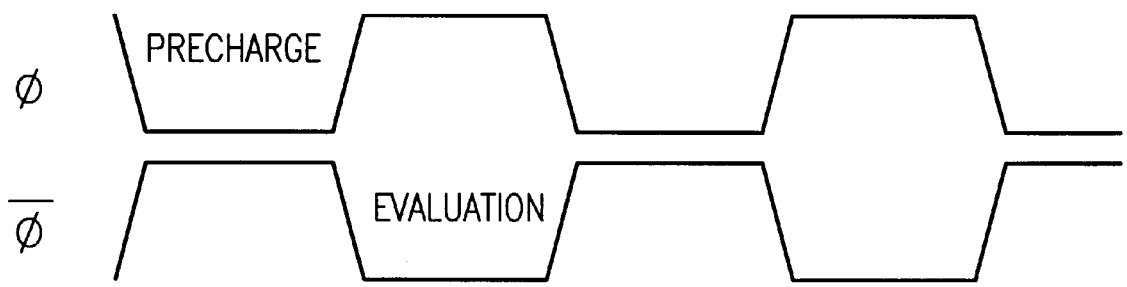
FIG. 5B shows the relative control sequence diagram of the novel dynamic logic circuit.

The discharge unit 504 comprises a logic block 514 to implement a Boolean function and an NMOS transistor 516. The logic block has a first terminal coupled to the charge unit 502 and a second terminal coupled to a ground voltage. The NMOS transistor 516 has a gate coupled to the second clock signal, a drain region coupled to the first terminal of the logic block 514, and a source region coupled to the ground voltage to discharge the discharge unit 504. FIG. 5B shows the relative waveforms of the clock control sequence. The circuit is operated in the precharge phase and the evaluation phase.

When the first clock signal $\phi=0$ and the second clock signal $\bar{\phi}=1$, the circuit is performing a precharge operation. The PMOS transistor 506 in the charge unit 502 is on and the NMOS transistor 508 in the charge unit 502 is off. The output terminal X is charged to logic 1. Meanwhile, the charge unit 502 and the discharge unit 504 are isolated by the NMOS transistor 508. No matter what circuit the logic gate 512 is, and no matter what the voltage O1 is, the voltage of the output terminal X is not affected. At the moment, $\bar{\phi}=1$, so that the NMOS transistor 516 of the discharge unit 504 is on, and the internal node Y is precharged to logic 0 (discharging).

When $\phi=1, \bar{\phi}=0$, the circuit performs an evaluation operation. Meanwhile, the PMOS transistor 506 and the NMOS transistor 516 are off, and the NMOS transistor 508 is on. The charge unit 502 and the discharge unit 504 conduct with each other. The logic value of the output terminal X is determined by the logic block 514. If the logic block 514 is to obtain a value of 0, the output terminal X is discharged to 0. If the logic block 514 is to obtain a value of 1, a charge redistribution occurs since the node X is precharged to logic 1 and the node Y is precharged to logic 0. The PMOS transistor 510 will help recharge X and Y up to logic 1 only to let the logic value of O1 be inverse to the logic value of X. The inputs of the logic unit circuit have to be stabilized before the evaluation operation, or only one transition from 0 to 1 is allowed in the evaluation operation. The output of the current circuit can be connected to a next stage via the output O1 of the logic gate 512. Or alternatively, the output O2 can be brought to connect to the next stage by adding an inverter 518.

FIGS. 6A to 6E illustrate a few possible assemblies of the dynamic logic circuit as the examples to implement the logic gate. One can easily prove that these assemblies meet the requirements of the above circuit operation. In these circuits, the gate B is optional. These circuits can be applied in different circumstances.

Figure 6A:
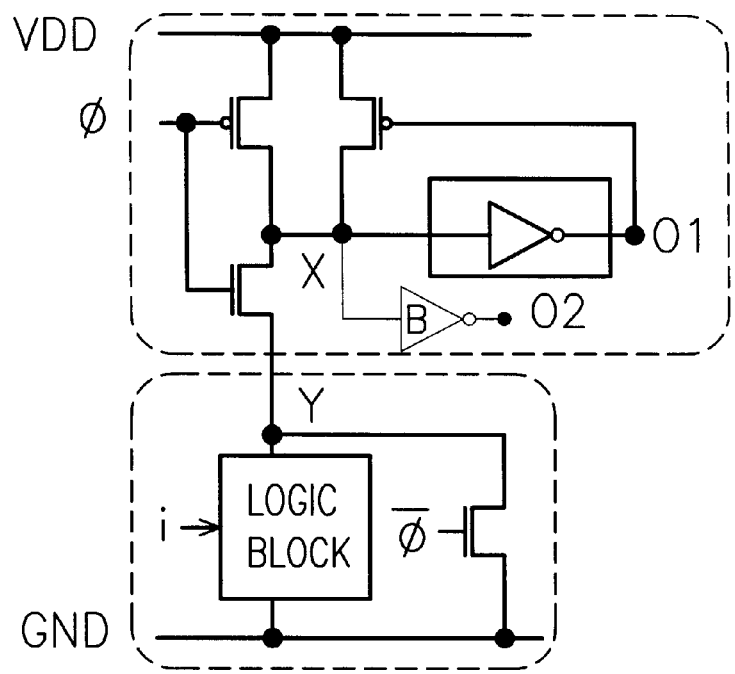
FIG. 6A shows a possible assembly of the novel dynamic logic circuit.

FIG. 6A shows a dynamic logic circuit of which the logic gate includes an inverter.

Figure 6B:
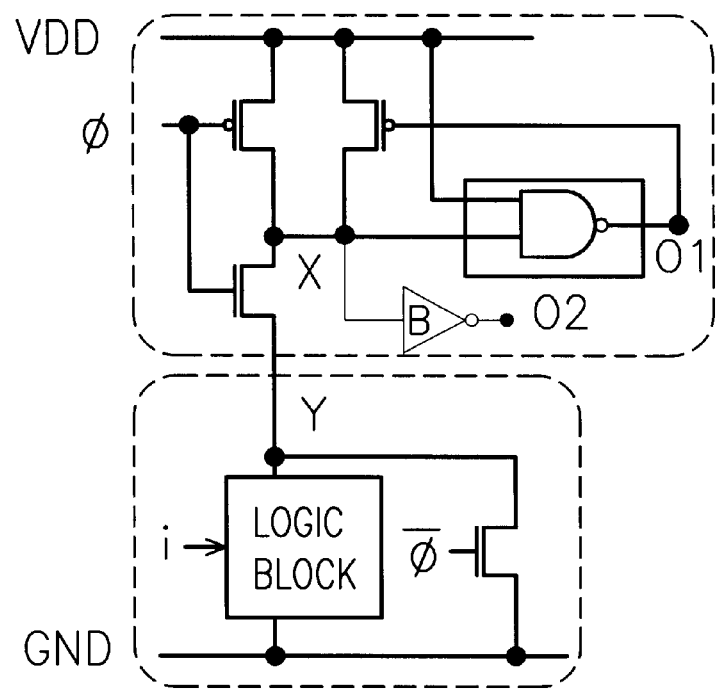
FIG. 6B shows another possible assembly of the novel dynamic logic circuit.

FIG. 6B shows a dynamic logic circuit of which the logic gate includes a NAND gate with two inputs. One of the inputs is coupled to logic 1, while the other input is coupled to the drain region of the feedback PMOS transistor.

Figure 6C:
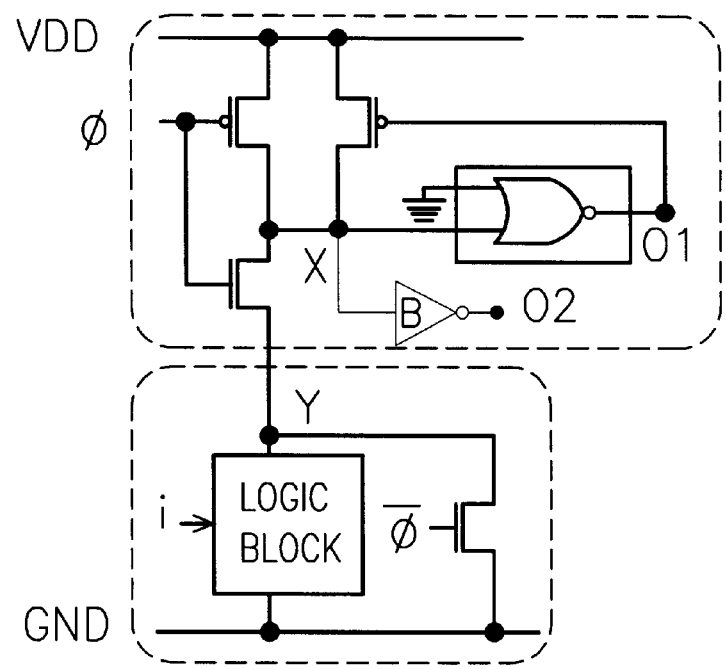
FIG. 6C shows another possible assembly of the novel dynamic logic circuit.

FIG. 6C shows a dynamic logic circuit of which the logic gate includes a NOR gate with two inputs. One of the inputs is coupled to logic 0, while the other input is coupled to the drain region of the feedback PMOS transistor.

Figure 6D:
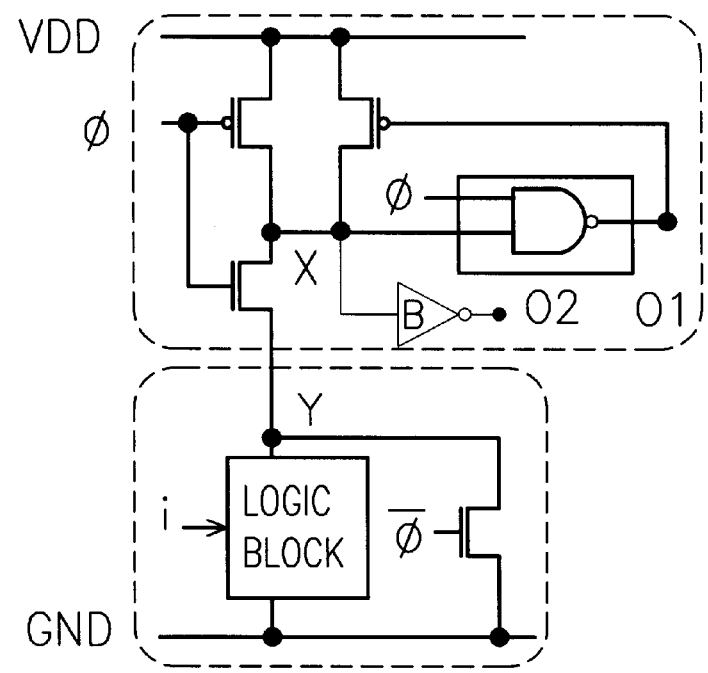
FIG. 6D shows another possible assembly of the novel dynamic logic circuit.

FIG. 6D shows a dynamic logic circuit of which the logic gate includes a NAND gate with two inputs. One of the inputs is coupled to the first clock signal, while the other input is coupled to the drain region of the feedback PMOS transistor.

Figure 6E:
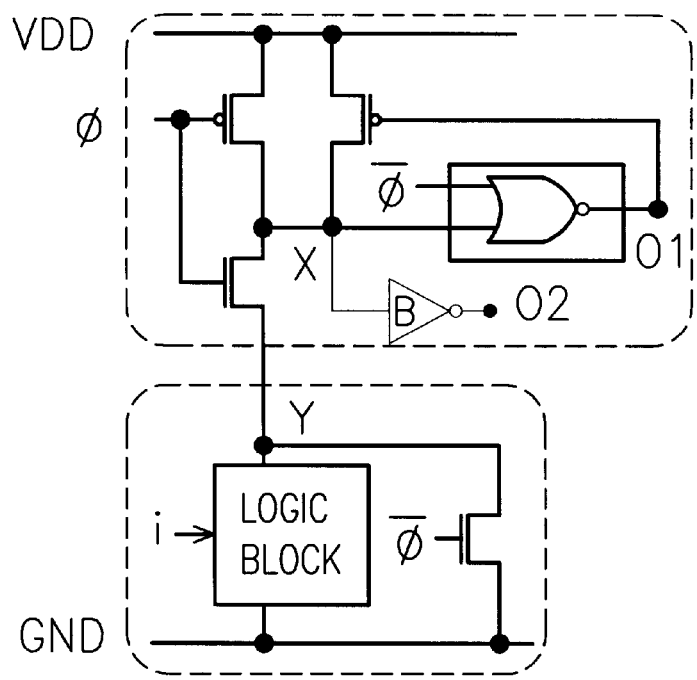
FIG. 6E shows another possible assembly of the novel dynamic logic circuit.

FIG. 6E shows a dynamic logic circuit of which the logic gate includes a NOR gate with two inputs. One of the inputs is coupled to the second clock signal, while the other input is coupled to the drain region of the feedback PMOS transistor.

Second Embodiment

Figure 7:
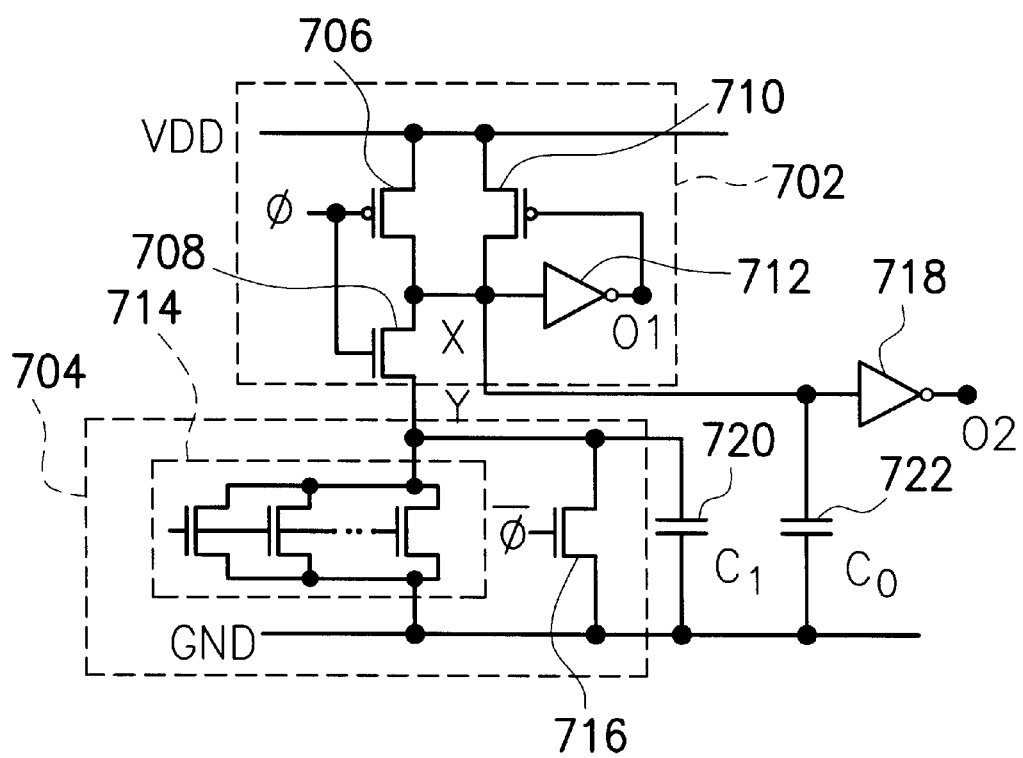
FIG. 7 shows a schematic drawing of a logic unit of the novel dynamic logic circuit.

FIG. 7 shows a logic unit of a dynamic logic circuit. The dynamic logic circuit comprises a charge unit 702 and a discharge unit 704 coupled to the charge unit 702. The charge unit 702 comprises a PMOS transistor 706, an NMOS transistor 708, a feedback PMOS transistor 710 and a logic gate 712. The PMOS transistor 706 has a gate coupled to the first clock signal and a source region coupled to a voltage source. The NMOS transistor 708 has a drain region coupled to a drain region of the PMOS transistor 706 and a source region coupled to the discharge unit 704 to isolate the connection with the discharge unit 704. The feedback PMOS transistor 710 has a drain region coupled to the drain region of the PMOS transistor 706, and a source region coupled to the voltage source to provide a voltage to the charge unit 702 for recharging operation. The logic gate 712 has an input terminal coupled to the drain region of the PMOS transistor 706, and an output terminal coupled to the gate of the feedback PMOS transistor 710. A signal inverse to the drain region of the PMOS transistor 706 is provided to the feedback PMOS transistor 710. The logic gate comprises an inverter. The PMOS transistor 706 and the NMOS transistor 708 are controlled by the first clock signal $\phi$. The discharge unit 704 comprises a logic block 714 to implement Boolean function and an NMOS transistor 716. The NMOS transistor 716 has a drain region coupled to the source region of the NMOS transistor 708 of the charge unit 702 to discharge the discharge unit 704. The NMOS transistor 716 is controlled by the second clock signal $\bar{\phi}$. The first and second clock signals are inverted with respect to each other. The output of the circuit is connected to the next stage by bringing the output O2 from an inverter 718. $C_0$ 722 is the lump capacitor of the node X, while $C_1$ 720 is the lump capacitor of the node Y.

The circuit is operated in the precharge phase and the evaluation phase. When the $\phi=0$ and $\bar{\phi}=1$, the circuit is performing a precharge operation. The PMOS transistor 706 is on and the NMOS transistor 708 is off. The output terminal X is charged to logic 1. Meanwhile, the charge unit 702 and the discharge unit 704 are isolated by the NMOS transistor 708. No matter what the voltage O1 is, the voltage of the output terminal X is not affected. At the moment, $\bar{\phi}=1$, so that the NMOS transistor 716 of the discharge unit 704 is on, and the internal node Y is precharged to logic 0 (discharging).

When $\phi=1, \bar{\phi}=0$, the circuit performs an evaluation operation. Meanwhile, the PMOS transistor 706 and the NMOS transistor 716 are off, and the NMOS transistor 708 is on. The charge unit 702 and the discharge unit 704 are conducted with each other. The logic value of the output terminal X is determined by the logic block 714. If the logic block 714 is to obtain a value of 0, the output terminal X is discharged as 0. If the logic block 714 is to obtain a value of 1, a charge redistribution occurs since the node X is precharged to logic 1 and the node Y is precharged to logic 0. Only to let the logic value of O1 inverse to the logic value of X, the PMOS transistor 710 will helps recharge X and Y up to logic 1.

Figure 8:
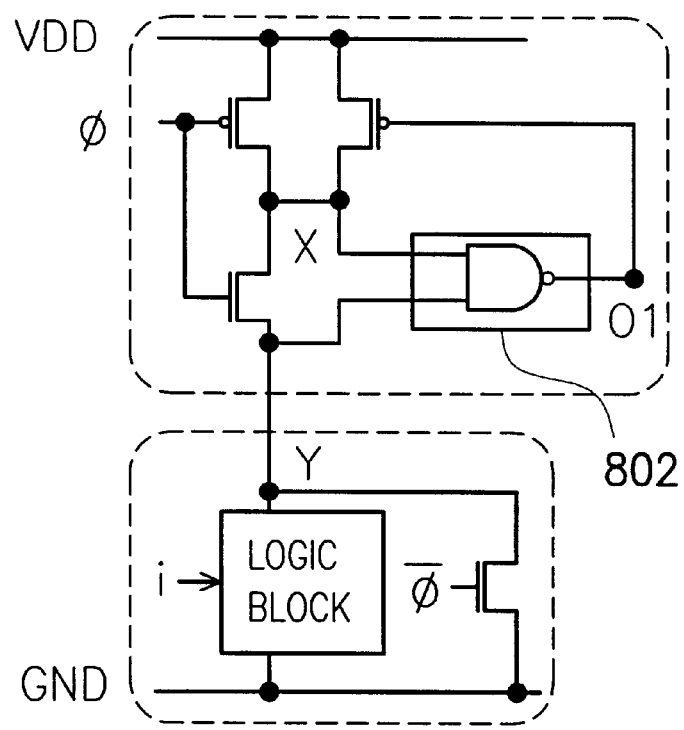
FIG. 8 shows a modification of the novel dynamic logic circuit.

FIG. 8 shows an application of the dynamic logic circuit. The application is modified from FIG. 6D. In addition to the existent advantages, the load of clock signal can be reduced, and the possibility of glitch caused by the output of the NAND gate 802 can be reduced.

Figure 9:
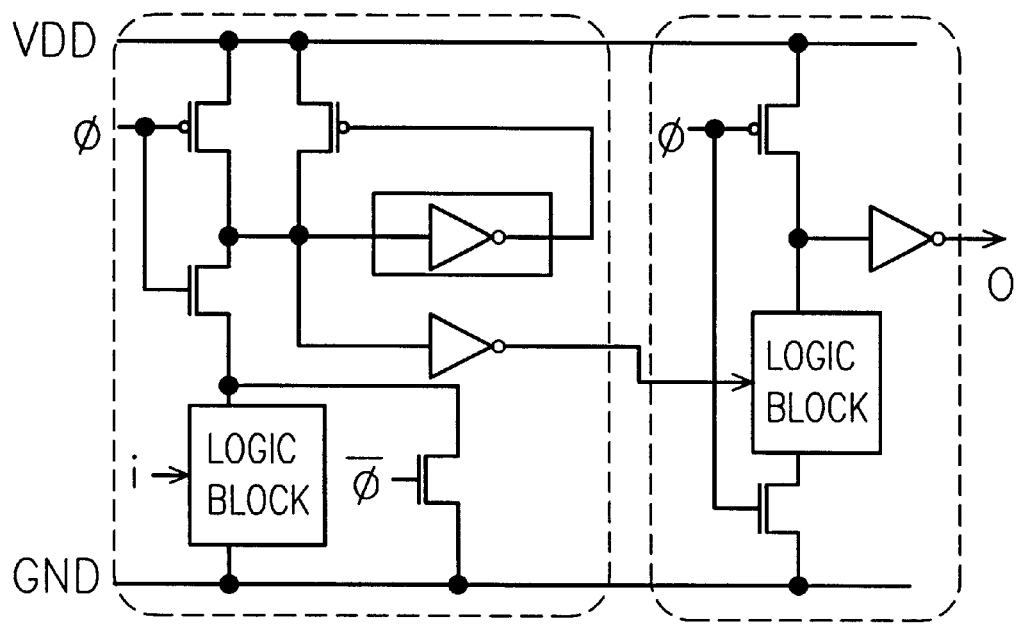
FIG. 9 shows an application of the novel dynamic logic circuit.

FIG. 9 shows an application of the invented dynamic logic circuit, wherein the invented dynamic logic circuit is applied to a domino circuit.

Figure 10:
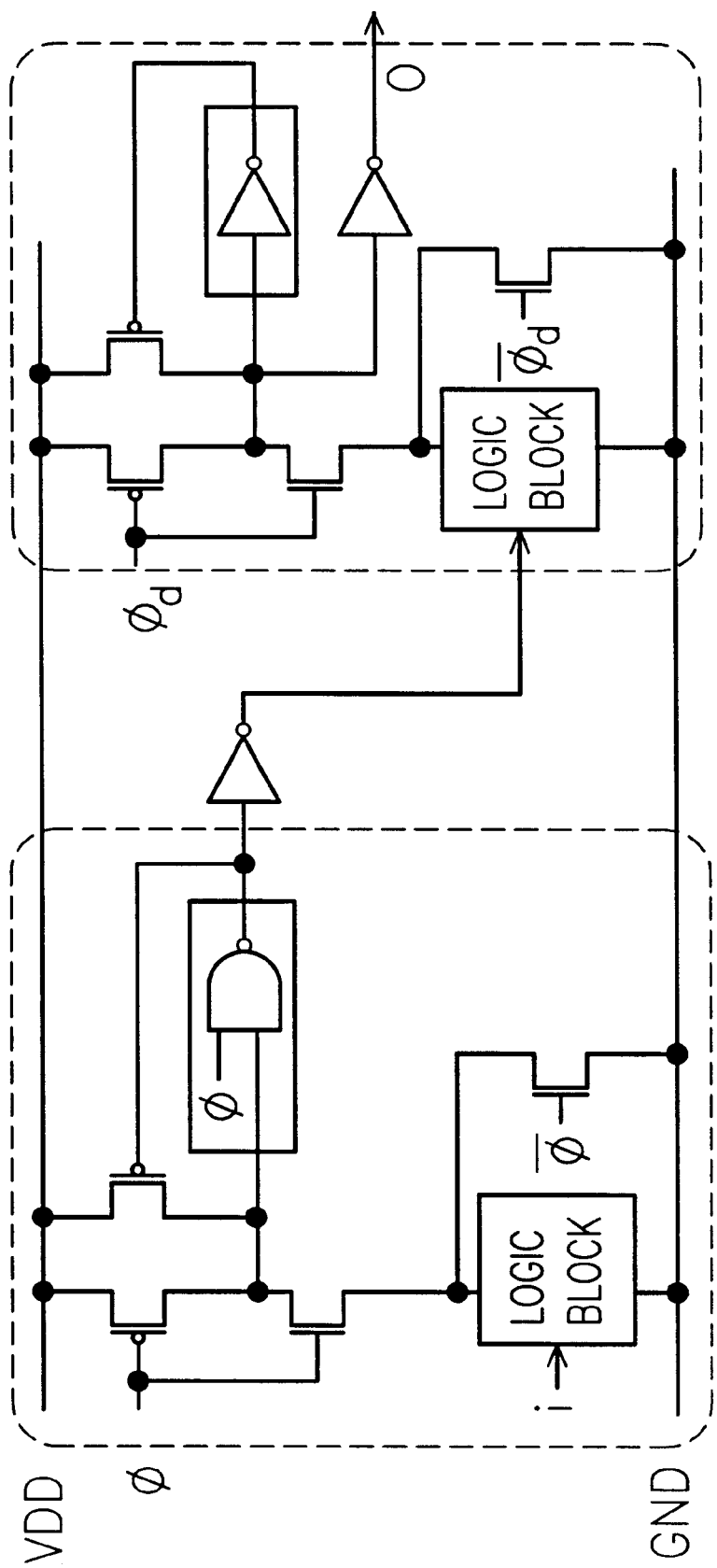
FIG. 10 shows another application of the novel dynamic logic circuit.

FIG. 10 shows an application of the invented dynamic logic circuit. In FIG. 10, the dynamic logic circuit is applied to a clock delay circuit.

According to the above, the invention includes at least the following advantages:

(1) The operation speed is increased.

Figure 1A:
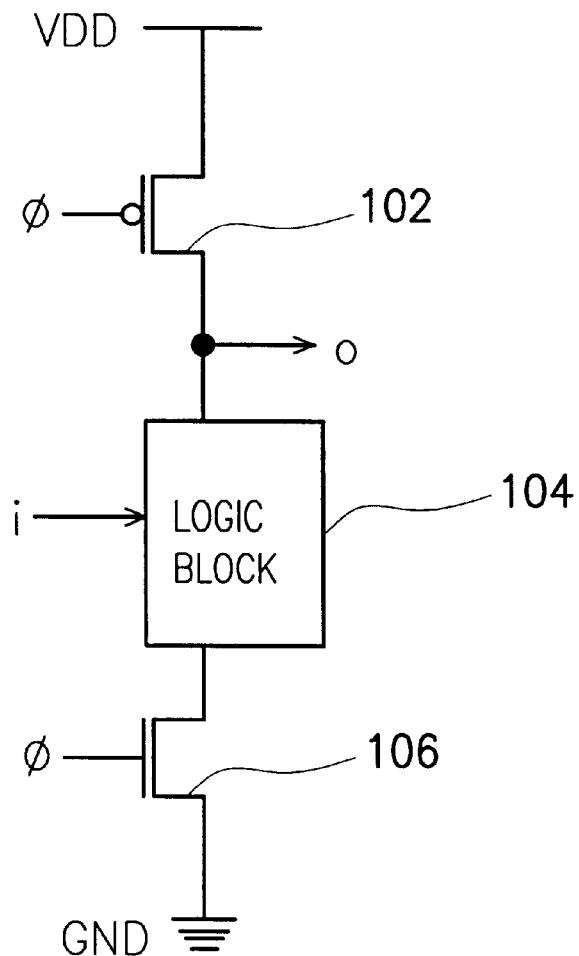
FIG. 1A shows a conventional dynamic logic circuit.
Figure 1B:
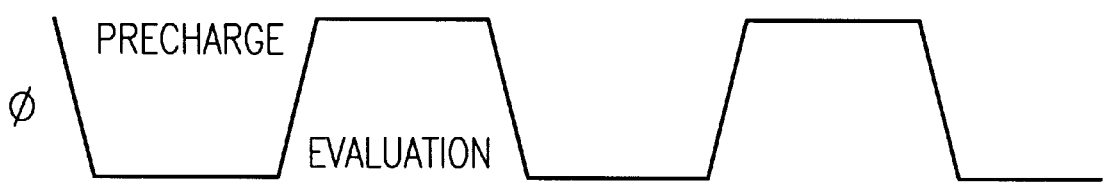
FIG. 1B shows a clock signal of the conventional dynamic logic circuit.
Figure 2A:
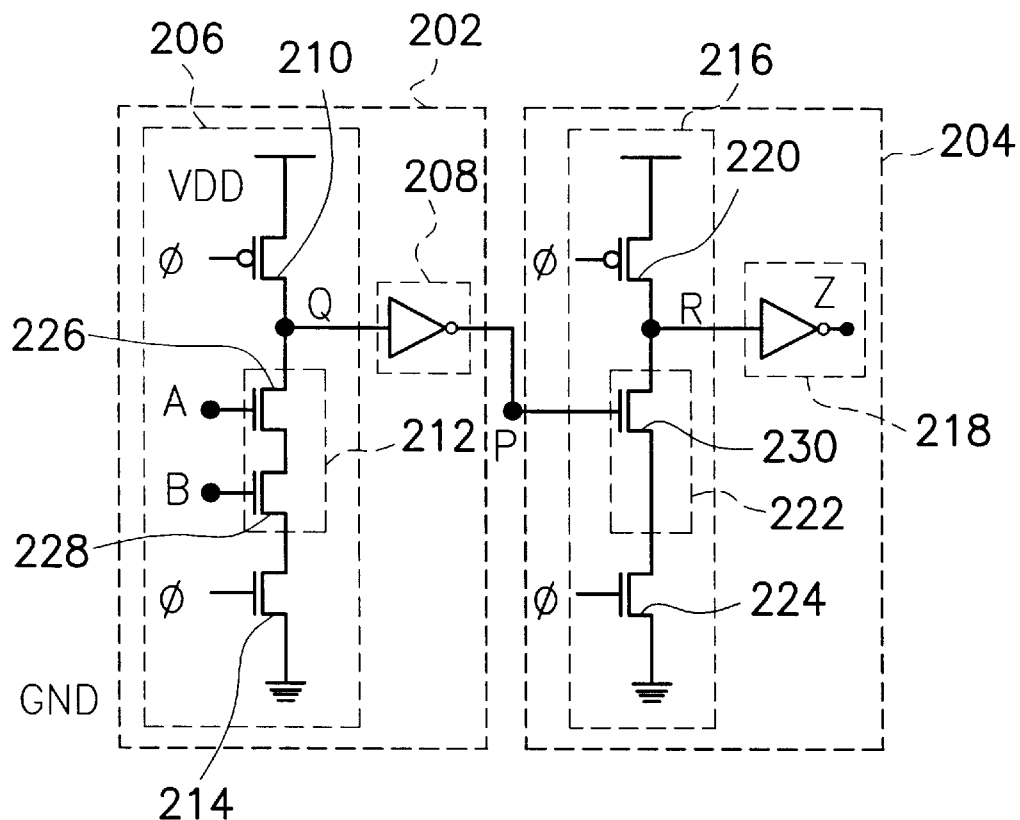
FIG. 2A shows a circuit diagram of a conventional dynamic logic circuit connected with a cascaded 2-stage domino circuit.
Figure 2B:
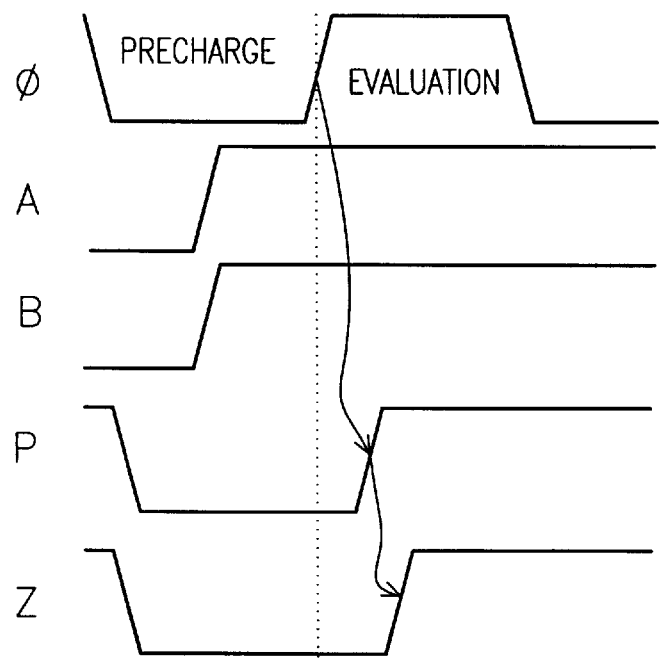
FIG. 2B shows the relative waveforms of the conventional dynamic logic circuit with a cascaded 2-stage domino circuit.
Figure 3A:
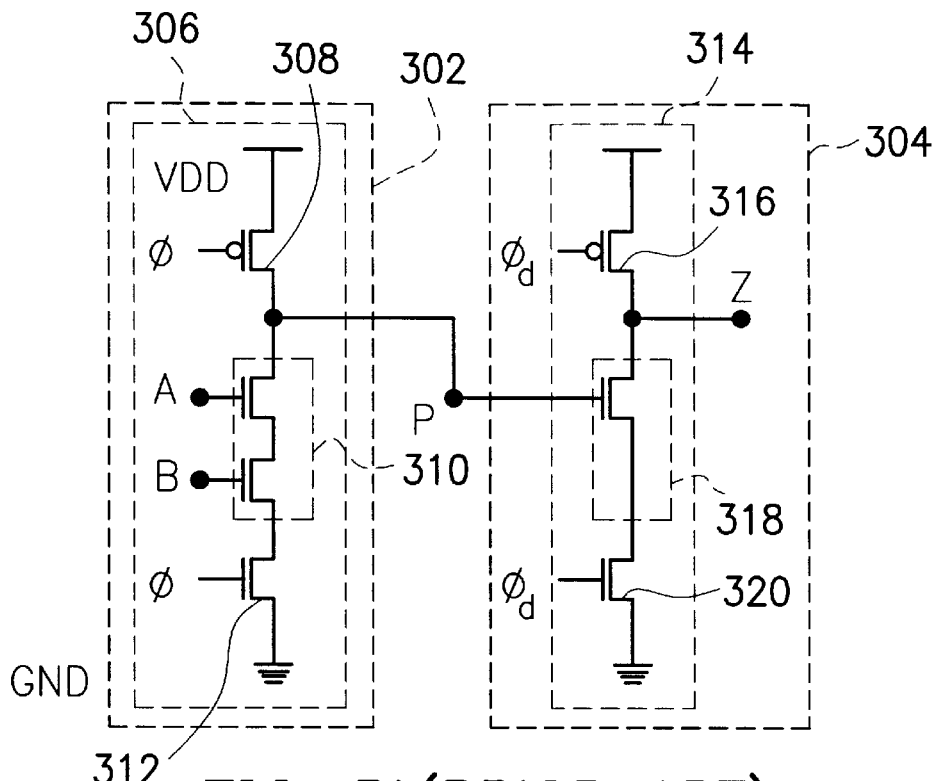
FIG. 3A shows a conventional dynamic logic circuit with a cascaded 2-stage clock delay circuit.
Figure 3B:
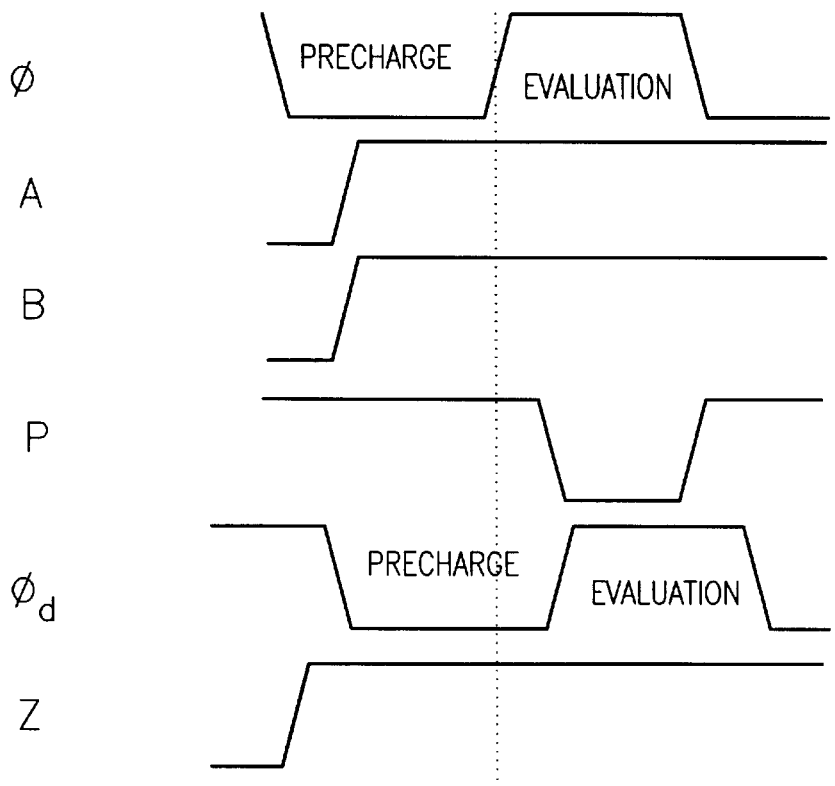
FIG. 3B shows the relative waveforms of the conventional dynamic logic circuit with a cascaded 2-stage clock delay circuit.
Figure 4:
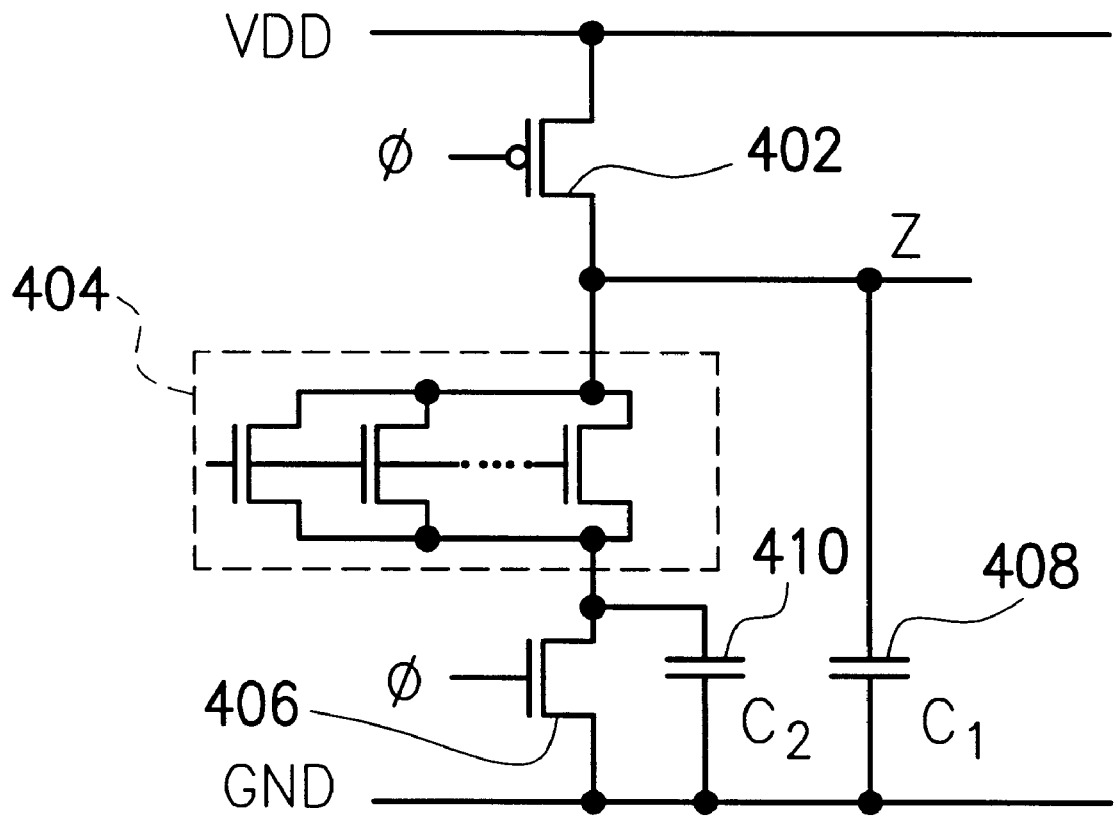
FIG. 4 shows a logic unit of a conventional dynamic logic circuit.

Referring to FIG. 7, comparing the conventional dynamic logic circuit shown in FIG. 4, the NMOS transistor 708 of the charge unit 702 is shifted between the output terminal X and the logic block 714, and a charge/discharge control is added. Since the lump capacitor $C_1$ 720 is completely discharged by the NMOS transistor 716 in the precharging phase, a charge redistribution occurs to $C_0$ 722 and $C_1$ 720 of the dynamic logic circuit when the evaluation operation starts whatever the input combination is. If the output terminal X is to be discharged to logic 0, the effect will enhance the circuit operation speed. On the other hand, the drain region Y of the NMOS transistor 716 is precharged to logic 0 to moderate the body effect, so that the circuit operation speed is enhanced. The invention uses the charge redistribution to speed up the circuit operation and to reduce the influence of body effect to the operation speed, so that the operation speed of the dynamic logic circuit can be effectively enhanced.

(2) The power consumption is reduced.

As the CMOS dynamic circuit does not have static power consumption, so that the major power consumption comes from the dynamic power consumption, and can be expressed as $$P = \sum_{i=1}^{n} \alpha C_i V_{DD}^2 f.$$

In the equation, $C_i$ is the lump capacitance of node i, $V_{DD}$ and $f$ is the operation voltage and frequency, respectively. If $V_{DD}$ and $f$ are fixed, only $\alpha$ and $C_i$ are to be considered. $\alpha C$ is defined as the power factor (PF) here.

Referring to FIG. 7, the power consumption of the dynamic logic circuit is effectively reduced because the NMOS transistor 708 is shifted between the output terminal X and the logic block 714. Since the NMOS transistor 708 is shifted upwardly, the circuit has to charge the lump capacitor $C_0$ 722 with a smaller capacitance only. If the probability of leaking the stored charges is large, the power consumption is attributed from the smaller $\alpha C_0$. Compared to the $\alpha C_1 + \alpha' C_2$ of the conventional dynamic logic circuit as shown in FIG. 4, the effect is much smaller. When the circuit complexity is greater, the effect is even more significant.

If all the inputs are 0, while entering the evaluation phase, the charges of $C_0$ 722 and $C_1$ 720 are redistributed. The PMOS transistor 710 will help pull up the output terminals X and Y to a high voltage $V_{DD}$ and $V_{DD} - V_{TN}$, respectively. The charges stored in node Y are leaked by the NMOS transistor 716 in the next precharge phase. Nevertheless, in this example, the power consumption is still small with a probability of $\frac{1}{2}^k$.

(3) The novel dynamic logic circuit can be combined with the conventional one.

Different CMOS dynamic logic circuits cannot be cascaded arbitrarily, otherwise, an electrical problem and a data race problem would occur. From certain analysis, referring to FIGS. 9 and 10, the novel dynamic logic circuit can be mixed with the conventional one for use without causing the above problems. Of course, the novel dynamic logic circuit can be used independently.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A low power dynamic logic circuit, comprising:
   a charge unit, coupled to a first clock signal; and
   a discharge unit, coupled to a second clock signal and the charge unit, wherein the first and second clock signals are in opposite phases,
   wherein the charge unit comprises:
      a PMOS transistor, having a gate coupled to the first clock signal, and a source region coupled to a voltage source;
      an NMOS transistor, having a gate coupled to the first clock signal, a drain region coupled to a drain region of the PMOS transistor and a source region coupled to the discharge unit;
      a feedback PMOS transistor, having a drain region coupled to the drain region of the NMOS transistor, and a source region coupled to the voltage source; and
      a logic gate, having a first terminal coupled to the drain region of the PMOS and a second terminal coupled to a gate of the feedback PMOS transistor, wherein the logic gate comprises a NAND gate with two input terminals, wherein one input terminal is connected to the first clock signal and another input terminal is connected to the drain region of the feedback PMOS transistor.

2. The low power dynamic logic circuit according to claim 1, wherein the discharge unit comprises:
   a logic block, having a first terminal coupled to the charge unit and a second terminal coupled to a ground voltage; and
   an NMOS transistor, having a gate coupled to the second clock signal, a drain region coupled to the first terminal of the logic block, and a source region coupled to the ground voltage.

3. The low power dynamic logic circuit according to claim 2, wherein the logic block comprises an NMOS transistor network.

4. The low power dynamic logic circuit according to claim 3, wherein the NMOS transistor network comprises K NMOS transistors connected in parallel, in series, in parallel-series, or in series-parallel.

5. The low power dynamic logic circuit according to claim 1, wherein when the first clock signal is logic 0 and the second clock signal is logic 1, the low power dynamic logic circuit is in a precharge phase, and when the first clock signal is logic 1 and the second clock signal is logic 0, the low power dynamic logic circuit is in an evaluation phase.

6. A low power dynamic logic circuit, comprising:
   a charge unit, coupled to a first clock signal; and
   a discharge unit, coupled to a second clock signal and the charge unit, wherein the first and second clock signals are in opposite phases,
   wherein the charge unit comprises:
      a PMOS transistor, having a gate coupled to the first clock signal, and a source region coupled to a voltage source;
      an NMOS transistor, having a gate coupled to the first clock signal, a drain region coupled to a drain region of the PMOS transistor and a source region coupled to the discharge unit;

a feedback PMOS transistor, having a drain region coupled to the drain region of the NMOS transistor, and a source region coupled to the voltage source; and a logic gate, having a first terminal coupled to the drain region of the PMOS and a second terminal coupled to a gate of the feedback PMOS transistor, wherein the logic gate comprises a NOR gate with two input terminals, wherein one input terminal is connected to the second clock signal and another input terminal is connected to the drain region of the feedback PMOS transistor.

7. The low power dynamic logic circuit according to claim 6, wherein the discharge unit comprises:

a logic block, having a first terminal coupled to the charge unit and a second terminal coupled to a ground voltage; and an NMOS transistor of the discharge unit, having a gate coupled to the second clock signal, a drain region coupled to the first terminal of the logic block, and a source region coupled to the ground voltage.

8. The low power dynamic logic circuit according to claim 7, wherein the NMOS transistor of the discharge unit comprises a NMOS transistor network.

9. The low power dynamic logic circuit according to claim 8, wherein the NMOS transistor network comprises K NMOS transistors connected in parallel, in series, in parallel-series, or in series-parallel.

10. The low power dynamic logic circuit according to claim 6, wherein when the first clock signal is logic 0 and the second clock signal is logic 1, the low power dynamic logic circuit is in a precharge phase, and when the first clock signal is logic 1 and the second clock signal is logic 0, the low power dynamic logic circuit is in an evaluation phase.

11. A low power dynamic logic circuit, comprising:

a charge unit, coupled to a first clock signal; and a discharge unit, coupled to a second clock signal and the charge unit, wherein the first and second clock signals are in opposite phases, wherein the charge unit comprises:

a PMOS transistor, having a gate coupled to the first clock signal, and a source region coupled to a voltage source;

an NMOS transistor, having a gate coupled to the first clock signal, a drain region coupled to a drain region of the PMOS transistor and a source region coupled to the discharge unit;

a feedback PMOS transistor, having a drain region coupled to the drain region of the NMOS transistor, and a source region coupled to the voltage source; and a logic gate, having a first terminal coupled to the drain region of the PMOS and a second terminal coupled to a gate of the feedback PMOS transistor, wherein the logic gate comprises a NAND gate with two input terminals, wherein one input terminals is connected to source region of the NMOS transistor of the charge unit and another input terminal is connected to the drain region of the feedback PMOS transistor.

12. The low power dynamic logic circuit according to claim 11, wherein the discharge unit comprises:

a logic block, having a first terminal coupled to the charge unit and a second terminal coupled to a ground voltage; and an NMOS transistor of the discharge unit, having a gate coupled to the second clock signal, a drain region coupled to the first terminal of the logic block, and a source region coupled to the ground voltage.

13. The low power dynamic logic circuit according to claim 12, wherein the NMOS transistor of the discharge unit comprises a NMOS transistor network.

14. The low power dynamic logic circuit according to claim 13, wherein the NMOS transistor network comprises K NMOS transistors connected in parallel, in series, in parallel-series, or in series-parallel.

15. The low power dynamic logic circuit according to claim 11, wherein when the first clock signal is logic 0 and the second clock signal is logic 1, the low power dynamic logic circuit is in a precharge phase, and when the first clock signal is logic 1 and the second clock signal is logic 0, the low power dynamic logic circuit is in an evaluation phase.

16. A low power dynamic logic circuit, comprising:

a charge unit, coupled to a first clock signal; and a discharge unit, coupled to a second clock signal and the charge unit, wherein the first and second clock signals are in opposite phases, wherein the discharge unit comprises:

a logic block, having a first terminal coupled to the charge unit and a second terminal coupled to a ground voltage; and an NMOS transistor, having a gate coupled to the second clock signal, a drain region coupled to the first terminal of the logic block, and a source region coupled to the ground voltage, wherein the NMOS transistor cause a charge redistribution at the first terminal, so as to at least increase the operation speed.

17. The low power dynamic logic circuit according to claim 16, wherein the charge unit comprises:

a PMOS transistor, having a gate coupled to the first clock signal, and a source region coupled to a voltage source;

an NMOS transistor, having a gate coupled to the first clock signal, a drain region coupled to a drain region of the PMOS transistor and a source region coupled to the discharge unit;

a feedback PMOS transistor, having a drain region coupled to the drain region of the NMOS transistor, and a source region coupled to the voltage source; and a logic gate, having a first terminal coupled to the drain region of the PMOS and a second terminal coupled to a gate of the feedback PMOS transistor, wherein the NMOS transistor of the discharge unit cause the charge redistribution at the first terminal of the logic block with respect to the drain region of the PMOS transistor of the charge unit.

* * * * *